(12) United States Patent
Huang et al.

(10) Patent No.: US 6,340,056 B1
(45) Date of Patent: Jan. 22, 2002

(54) FLOW CHANNEL TYPE HEAT DISSIPATING FIN SET

(75) Inventors: Meng-Cheng Huang, Taipei Hsien; Tony Wang, Sanchung, both of (TW)

(73) Assignee: Chaun-Choung Technology Corp., Taipei Hsien (TW)

( * ) Notice: Subject to any disclaimer, the term of this patent is extended or adjusted under 35 U.S.C. 154(b) by 0 days.

(21) Appl. No.: 09/840,159

(22) Filed: Apr. 24, 2001

(51) Int. Cl.⁷ .................................................. F28F 7/00
(52) U.S. Cl. ...................... 165/185; 165/80.3; 174/16.3; 361/704
(58) Field of Search ................................ 165/185, 80.3, 165/104.33, 80.2, 80.4; 29/890.03; 174/16.3; 361/697, 704; 257/722

(56) References Cited

U.S. PATENT DOCUMENTS

| | | | | |
|---|---|---|---|---|
| 2,419,233 A | * | 4/1947 | Spender | 165/80.3 |
| 2,434,676 A | * | 1/1948 | Spender | 165/80.3 |
| 5,509,465 A | * | 4/1996 | Lai | 174/16.3 |
| 5,558,155 A | * | 9/1996 | Ito | 165/80.3 |
| 6,062,301 A | * | 5/2000 | Lu | 165/80.3 |
| 6,104,609 A | * | 8/2000 | Chen | 257/722 |
| 6,269,003 B1 | * | 7/2001 | Wen-Chen | 361/704 |

* cited by examiner

*Primary Examiner*—Ira S. Lazarus
*Assistant Examiner*—Terrell McKinnon
(74) *Attorney, Agent, or Firm*—Rosenberg, Klein & Lee

(57) ABSTRACT

A flow channel type heat dissipating fin set is formed by a plurality of metal pieces. Each metal piece comprises a body; and a connecting piece installed on the body having one or more connecting pieces punched from the body; the connecting piece being protruded from one side of the body; a via hole being formed on the body; and buckles and buckling holes being formed on the body. The metal pieces are combined by buckling the buckles and buckling holes so that the metal pieces are continuously buckled and stacked as a heat dissipating fin set; and via holes on the bodies of the metal pieces are formed as longitudinal flow channels. Thus, a flow channel type heat dissipating fin set is formed.

3 Claims, 9 Drawing Sheets

FLOW CHANNEL TYPE HEAT DISSIPATING FIN SET

FIELD OF THE INVENTION

The present invention relates to a flow channel type heat dissipating fin set, and especially to heat dissipating fin set with a preferred heat dissipating efficiency and having a preferred heat dissipating ability.

BACKGROUND OF THE INVENTION

Since the rapid development of computer industry, the heat emitting of chips of microprocessors and microelectronic heat emitting elements are increased rapidly, and the sizes thereof are increased. In order to emit heat out of the system so as to sustain the electronic heat emitting element in operation in allowable temperatures, in general, a heat dissipating fin set with a larger area is appended to the surface of the electronic heat emitting elements for assisting heat dissipation, so as to control the operation and lifetime of the electronic heat emitting element.

The current general used heat dissipating fin set are formed by aluminum extrusion type, molding and stacking. The densities (total heat dissipating area of unit volume) of the aluminum extruding and molding heat dissipating fin sets are finite due to the confinement of the mechanic finishing ability. Therefore the heat dissipating fin set used to electronic heat emitting elements with large heat dissipation have larger volume and weight, while the stacking heat dissipating fin set has a higher density so as to replace the aluminum extruding or molding heat dissipating fin sets.

Referring to FIG. 1, a prior art heat dissipating fin set 10a is illustrated, which is made by mechanically punching so as to punch a plurality of metal pieces 11a into a predetermined size. The metal piece 11a is made of copper or aluminum or other materials. The metal piece 11a is punched to be formed with a ⊏ shape, or L shape or I shape. Each of the metal pieces 11 includes a body 12. The body 12 has an upper and a lower side which are connected to parallel folded edges 13. The metal pieces 11a are glued or welded to a heat dissipating seat 20a by the folding edges 13a at the lower side of the body 12. The heat dissipating seat 20 is made of copper or aluminum so that it can be attached to the surface of an electronic heat dissipating elements.

However, the above prior heat dissipating fin set 10a is formed with a transverse gap between metal pieces 11a and thus air only flows between metal pieces 11a instead of flowing longitudinally between metal pieces 11. Therefore, heat dissipating fin set 10a has no preferred heat dissipating effect and thus, heat dissipation is not good.

Furthermore, in the prior art, as the metal pieces 11a are assembled, the bottom of the heat dissipating fin set is formed as a plane which can not match the shapes of the surfaces of the heat dissipating seat and electronic heat emitting element. Thus, it can not be adhered to the heat dissipating seat and electronic heat emitting elements of various shapes. The application is strictly confined.

Moreover, in the prior heat dissipating fin set 10a, the metal pieces 11a are glued or welded to the heat dissipating seat 20a one by one, this is time and labor consumed. Therefore, a higher cost is necessary.

SUMMARY OF THE INVENTION

Accordingly, the primary object of the present invention is to provide a flow channel type heat dissipating fin set, wherein in the present invention, not only transversal gaps are formed between different metal pieces so that air flow can flow between metal pieces. Moreover, air flows along the flow channels formed by the via holes in the metal pieces. Therefore the heat dissipating fin set has a preferred heat dissipating efficiency so as to present a preferred heat dissipating ability.

Another object of the present invention is to provide a flow channel type heat dissipating fin set, wherein the longitudinal size of the buckling hole of the present invention is slightly larger than the size of the buckle, so that the longitudinal length of the heat dissipating fin set is telescopic and is flexible. Therefore the bottom of the heat dissipating fin set may be a cambered surface, a curved surface, etc., so as to match the shape of the surface of an electronic heat emitting element on the heat dissipating seat so as to be adhered to heat dissipating seats and electronic heat emitting elements of various shapes. Therefore the application of the present invention is flexible.

To achieve the object, the present invention provides a flow channel type heat dissipating fin set formed by a plurality of metal pieces. Each metal piece comprises a body; and a connecting piece installed on the body having one or more connecting pieces punched from the body; the connecting piece being protruded from one side of the body; a via hole being formed on the body; and buckles and buckling holes being formed on the body. The metal pieces are combined by buckling the buckles and buckling holes so that the metal pieces are continuously buckled and stacked as a heat dissipating fin set; and via holes on the bodies of the metal pieces are formed as longitudinal flow channels. Thus, the flow channel type heat dissipating fin set is formed.

The various objects and advantages of the present invention will be more readily understood from the following detailed description when read in conjunction with the appended drawing.

DETAILED DESCRIPTION OF THE PREFERRED EMBODIMENTS

Figure 1:
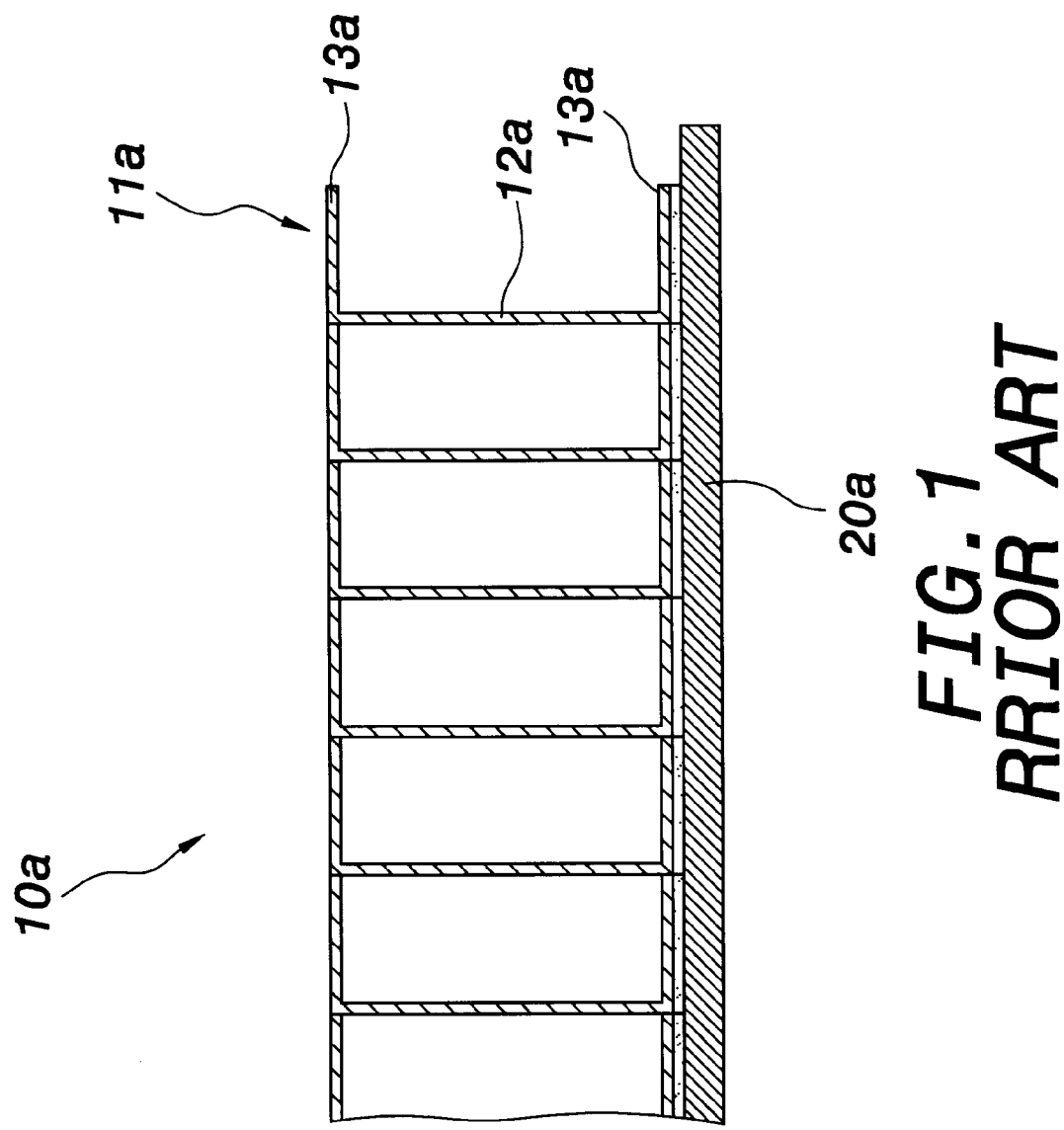
FIG. 1 is a plane view of the prior heat dissipating fin set in the prior art.
Figure 2:
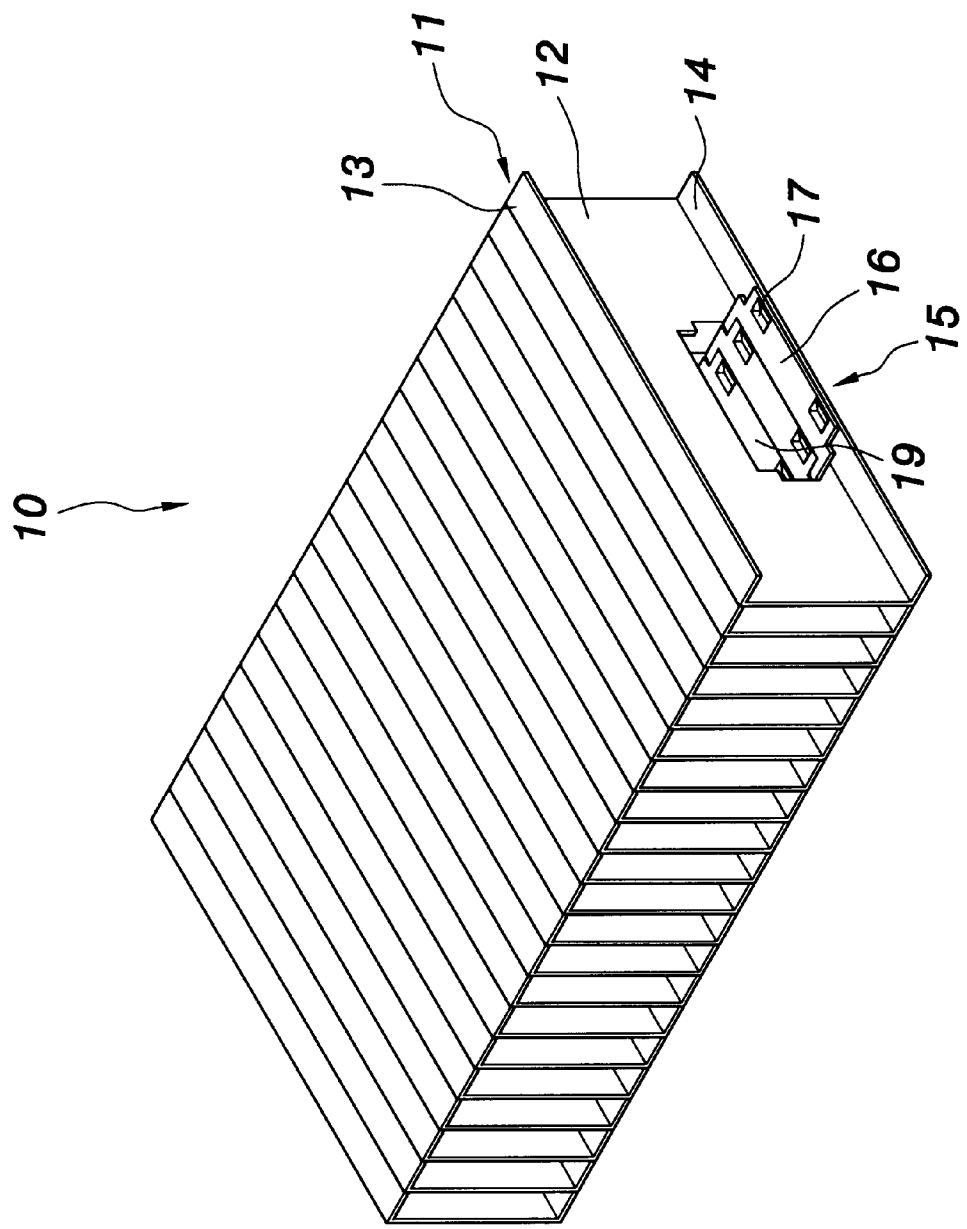
FIG. 2 is an assembled perspective view of the first embodiment in the present invention.
Figure 3:
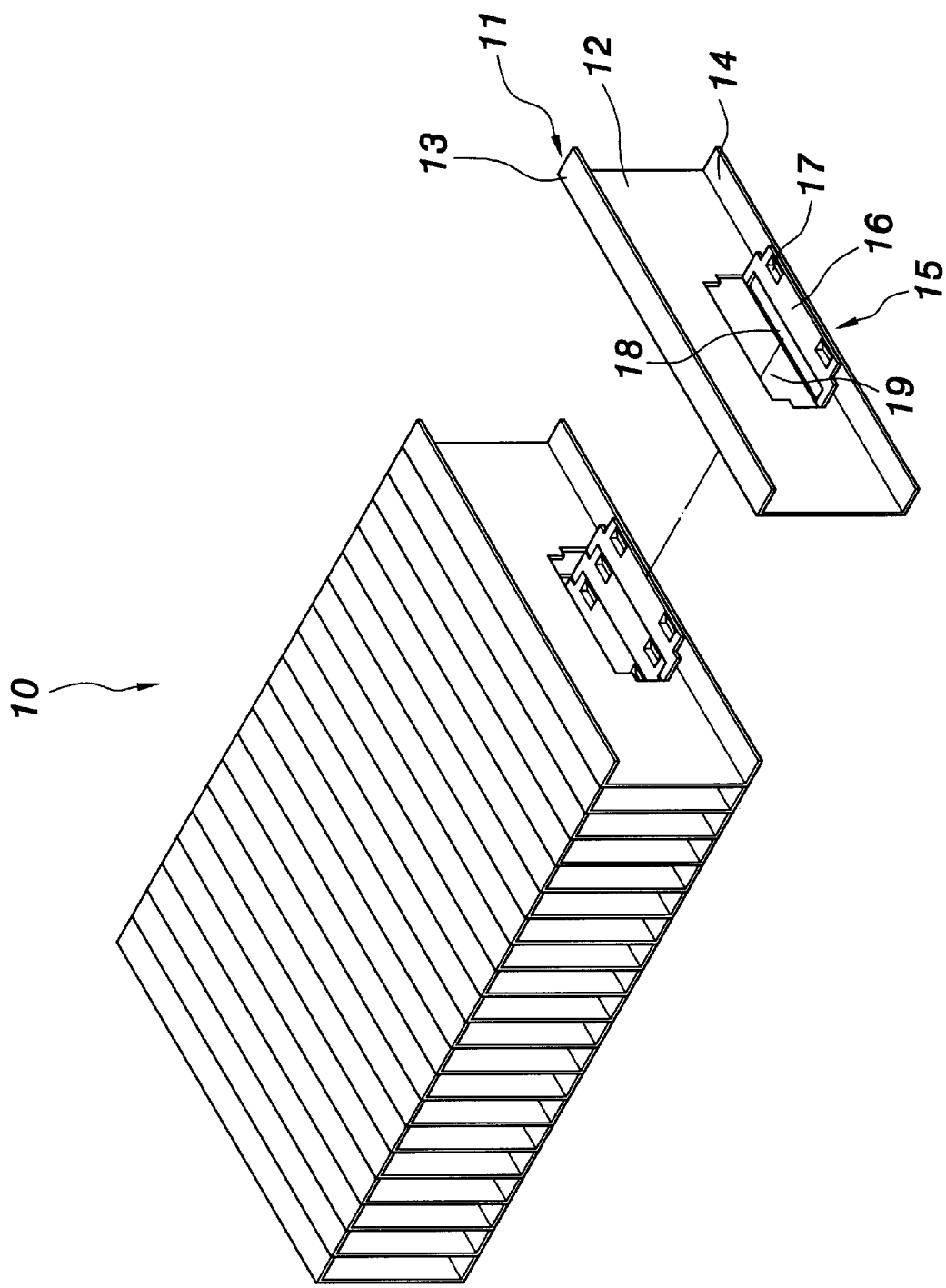
FIG. 3 is an exploded perspective view of the first embodiment in the present invention.
Figure 4:
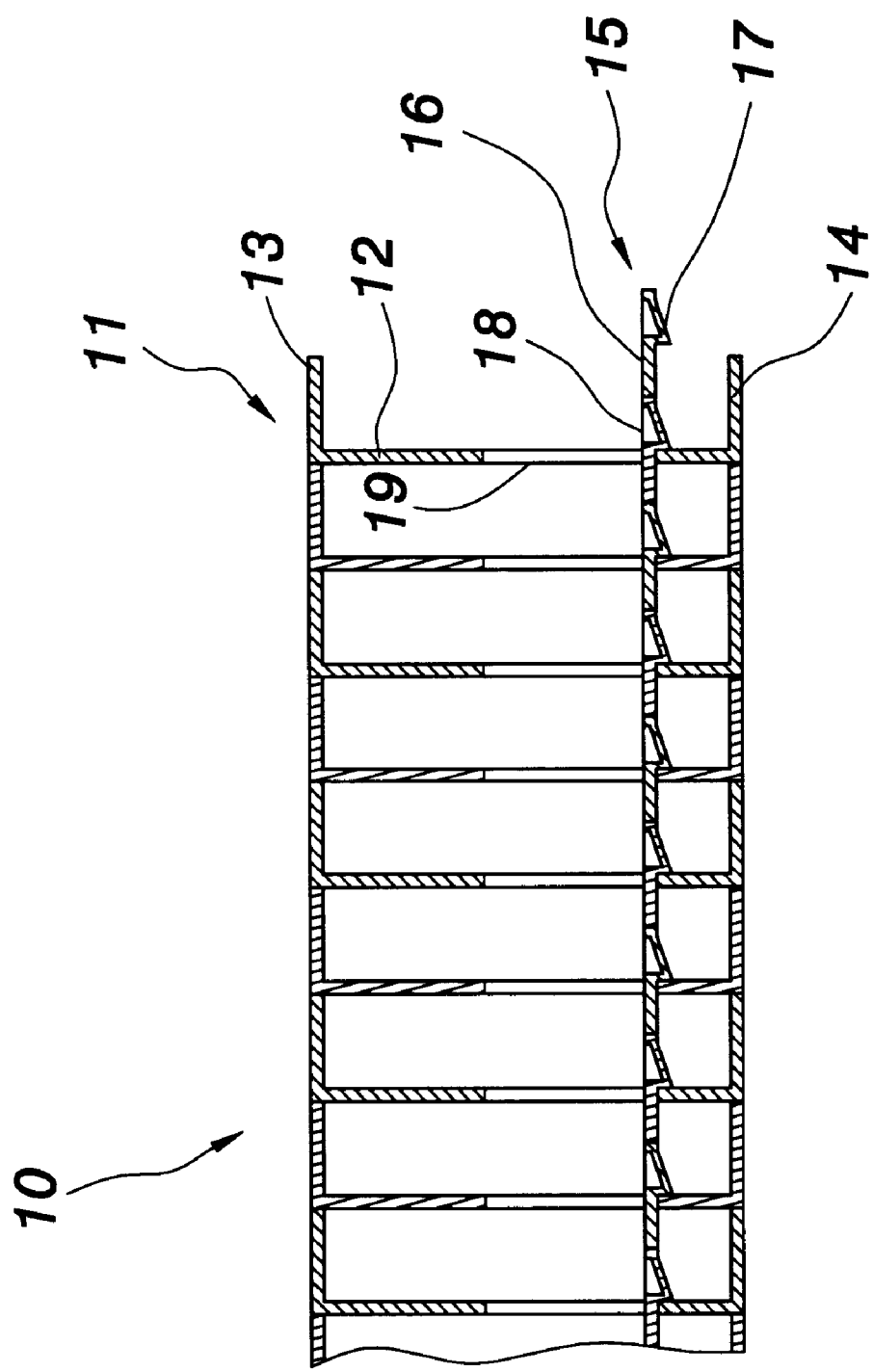
FIG. 4 is a plane view of the first embodiment in the present invention.

Referring to FIGS. 2, 3, and 4, the flow channel type heat dissipating fin set of the present invention is illustrated. The heat dissipating fin set is formed by a plurality of metal pieces 11 by mechanically punching. The metal piece 11 is made of copper or aluminum or other material with better heat conductivity. The metal piece 11 is punched to be formed with a ⊏ shape. Of course, the metal piece 11 can be punched to have an L shape or an I shape, or other shapes. Each of the metal pieces 11 includes a body 12. The body 12 has an upper and a lower side which are connected to a first folded edge 13 and a second folded edge 14. The first folded edge 13 and second folded edge 14 are perpendicular to the body 12. The two folded edges 13, and 14 are parallel since abovesaid heat dissipating fin set has a structure approximately equal to the structure in the prior art and not the main scope of the present invention. Thus, the detail will be described herein.

In the present invention, a connecting unit 15 is installed on the body 12 of the metal piece 11, so that the metal pieces 15 are stacked Thereby, the connecting unit 15 will form with a heat dissipating fin set 10 with a certain volume.

The heat dissipating fin set 15 has one or more connecting pieces 16 punched from the body 12. The connecting pieces 16 are protruded from one side of the body 12. The shape of the connecting piece 16 is not confined, but is vertical to the body 12 and has a predetermined length for buckling one by one.

After punching the connecting pieces 16, one or more via holes 19 with respective to the connecting pieces 16 are formed on the body 12. A flow channels are formed by the via holes 19 so that air may flow smoothly.

Figure 6:
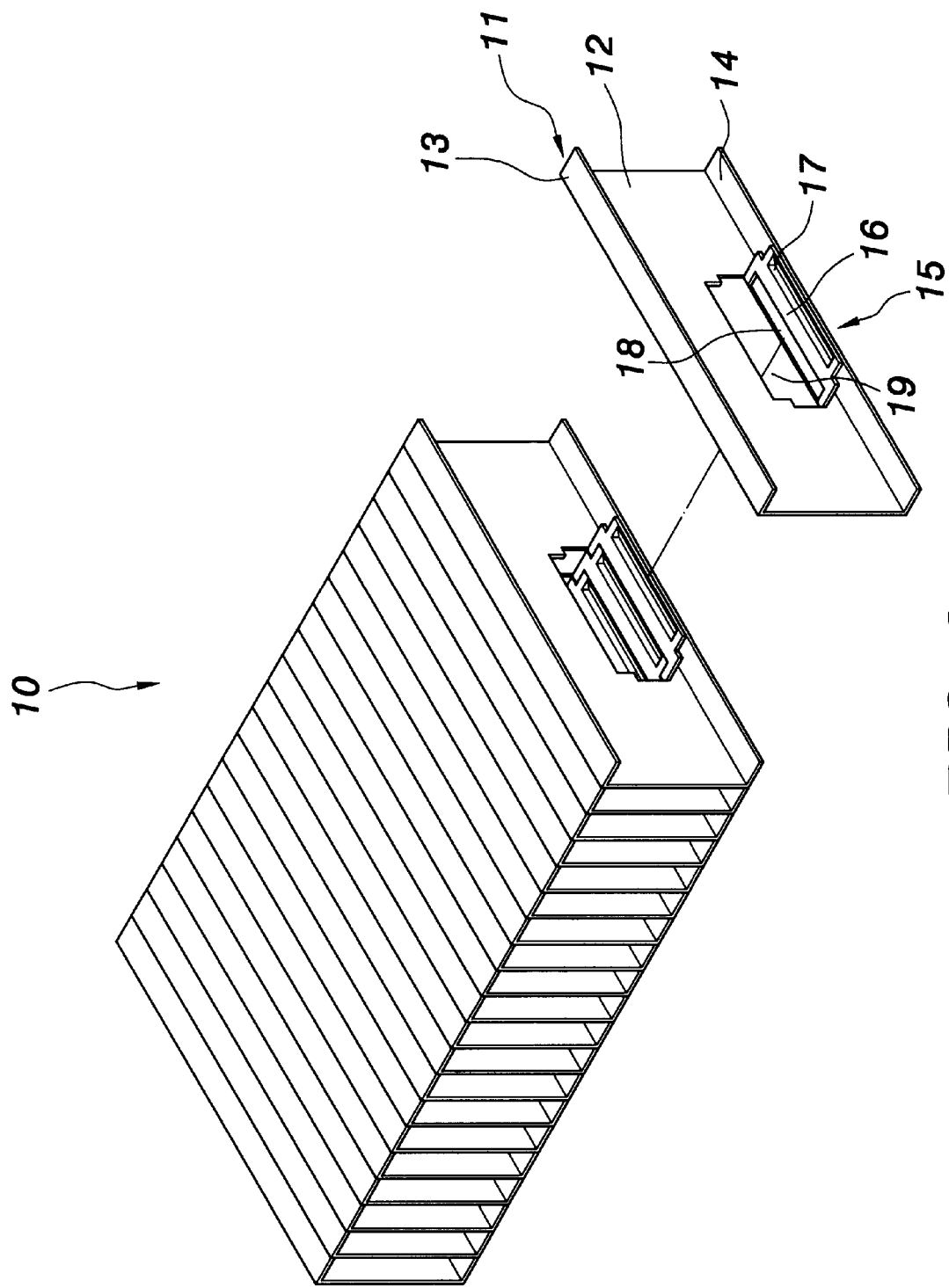
FIG. 6 is an exploded perspective view of the second embodiment in the present invention.
Figure 7:
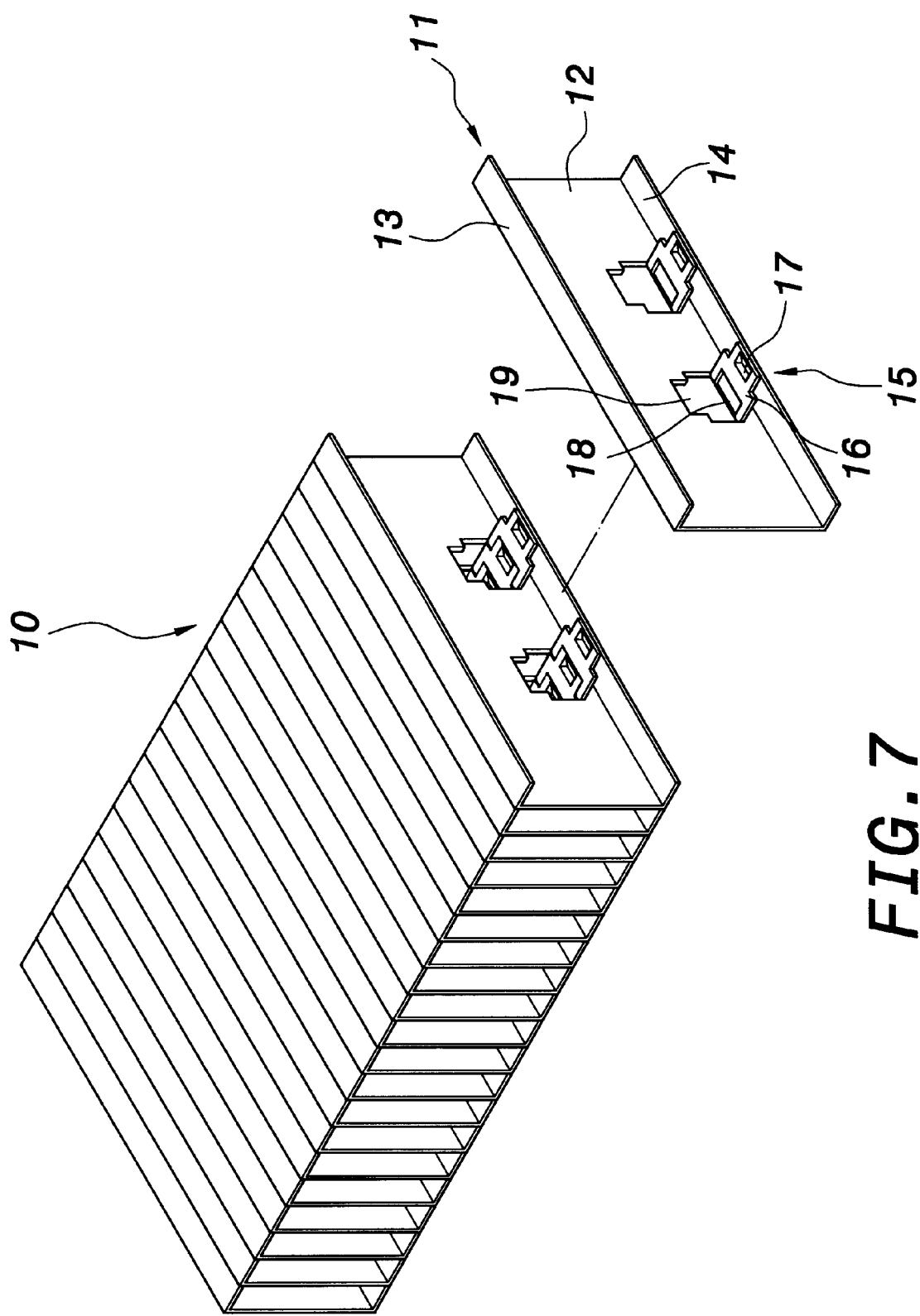
FIG. 7 is an exploded perspective view of the third embodiment in the present invention.
Figure 8:
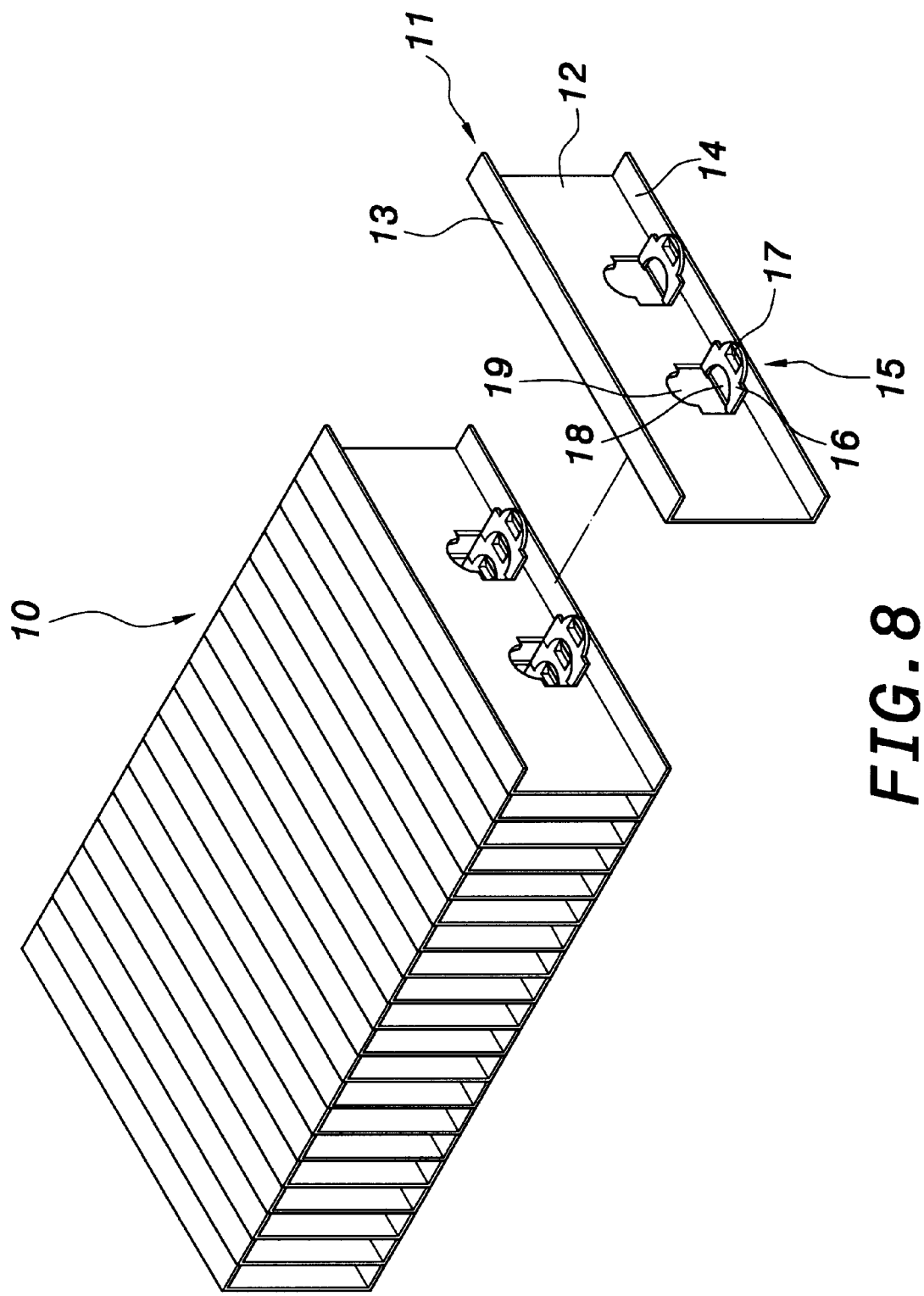
FIG. 8 is an exploded perspective view of the fourth embodiment in the present invention.
Figure 9:
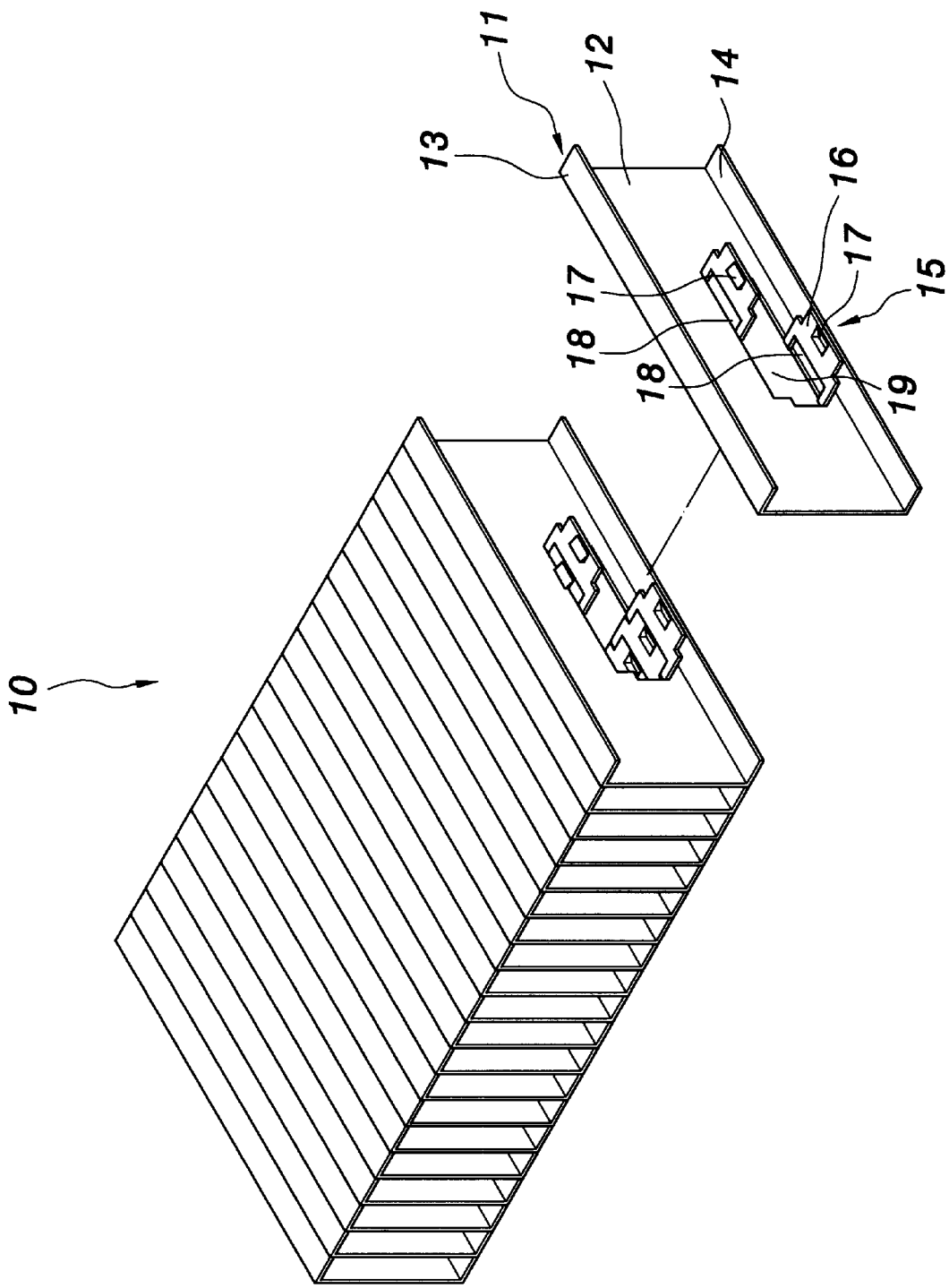
FIG. 9 is an exploded perspective view of the fifth embodiment in the present invention.

One or more buckles 17 are punched from the connecting pieces 16. In this embodiment, two buckles 17 are formed. One or more respective buckling holes 18 are shaped on the connecting piece 16. In this embodiment, one oblong buckling hole 18 is installed. The buckle 17 and buckling hole 18 are installed at two respective surfaces of the connecting piece 16, i.e., at the bottom and top surface. The shapes of the connecting piece 16, buckle 17 and buckling hole 18 are not confined, which can be varied as desired (referring to FIGS. 6, 7 and 8). It may be round shapes, elliptical shapes, polygonal shapes, or other shapes. The numbers thereof are selectively as desired. The connecting piece 16 on the body 12 of the metal piece 11 may be installed at the upper and lower sides.

The longitudinal size of the metal piece 11 may be slightly larger than that of the buckle 17 so that the after the buckle 17 is buckled to the buckling hole 18, a little gap is formed therebetween so that the longitudinal length of the heat dissipating fin set 10 is telescopic and is flexible.

The various metal pieces 11 are buckled by the buckle 17 and buckling hole 18 so that the metal pieces 11 are buckled continuously and stacked as a heat dissipating fin set 10. By the abovesaid components, the flow channel type heat dissipating fin set of the present invention is formed.

Figure 5:
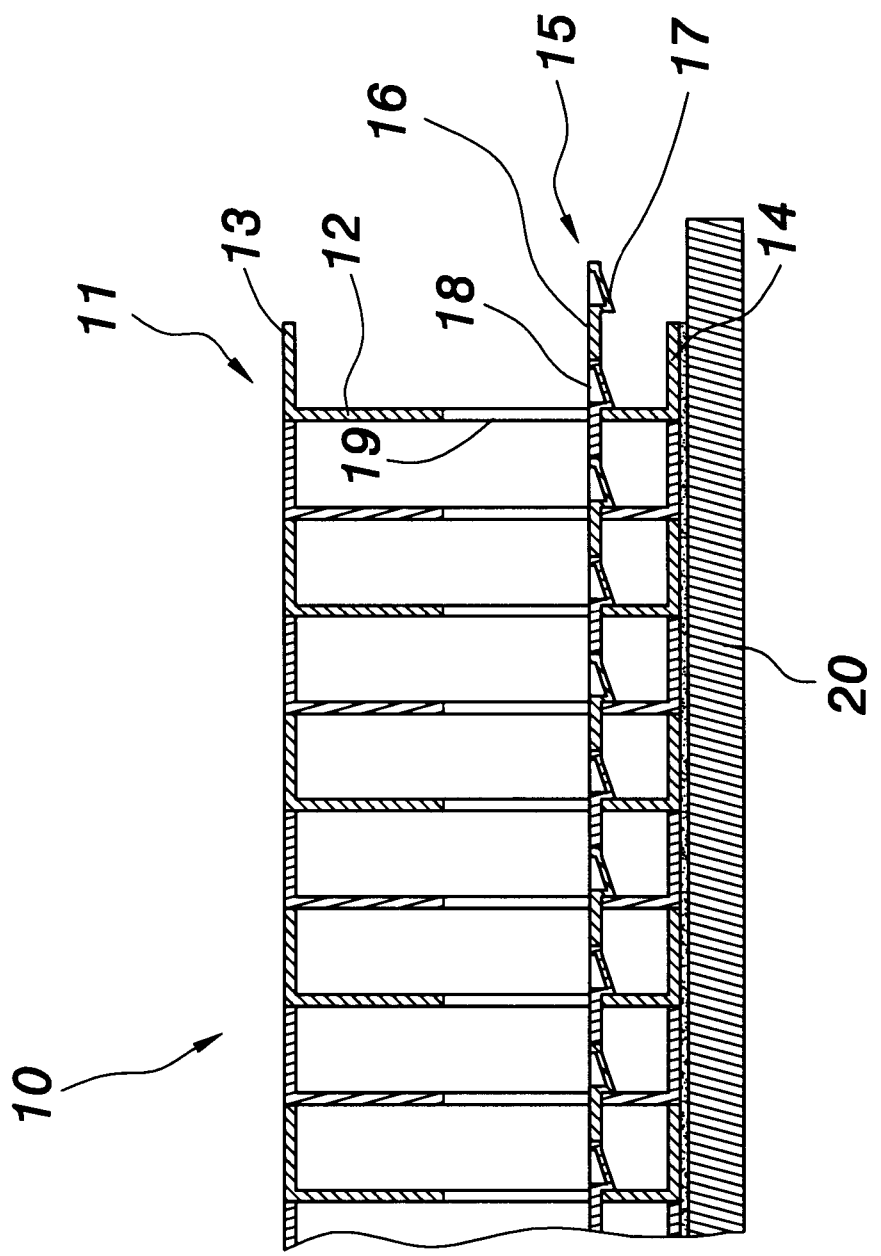
FIG. 5 is a schematic view showing the application of the first embodiment in the present invention.

As illustrated in FIG. 5, the heat dissipating fin set 10 of the present invention is glued or welded to a heat dissipating seat 20 through the second folded edge 14 at the lower side of the body 12. The heat dissipating seat 20 is made of copper or aluminum so that by the heat dissipating seat 20, the present invention can be attached to the surface of an electronic heat emitting element (not shown) for heat dissipation. This heat dissipating fin set has a high density heat dissipating area. Furthermore, the metal pieces 11 of heat dissipating fin set of the present invention are buckled and stacked by the connecting units 15, so as to be formed with a heat dissipating fin set 10 with a finite volume. Then, they are connected to the heat dissipating seat 20 without needing to connect the metal piece 11 to the heat dissipating seat 20. The assembly work is time and labor saving and thus the cost is reduced greatly.

In the present invention, the connecting unit 15 is installed to the body 12 of the metal piece 11. Therefore as the connecting unit 15 is formed, the via hole 19 can be also formed on the body 12. As the metal pieces 11 are buckled by the buckles 17 and the buckling holes 18 so as to be formed as the heat dissipating fin set 10, longitudinal flow channels are formed.

In the present invention, not only transversal gaps are formed between different metal pieces 11 so that air flow can flow between metal pieces 11, but also air flows along the flow channels formed by the via holes 19 in the metal pieces 11. Therefore the heat dissipating fin set 10 has a preferred heat dissipating efficiency so as to present a preferred heat dissipating ability.

Furthermore, in the present invention, the connecting unit 15 is installed on the body 12 of the metal piece 11, and thus, the first folded edge 13 and second folded edge 14 at the upper an lower sides of the body 12 are not affected. The shapes of the first folded edge 13 and second folded edge 14 may be modified as desired.

Another, the longitudinal size of the buckling hole 18 of the present invention is slightly larger than the size of the buckle 17, so that the longitudinal length of the heat dissipating fin set is telescopic and flexible. Therefore the bottom of the heat dissipating fin set 10 may be a cambered surface, a curved surface, etc., so as to match the shape of the shape on the surface of an electronic heat emitting element on the heat dissipating seat, so as to be adhered to heat dissipating seats and electronic heat emitting elements of various shapes. Therefore the application of the present invention is flexible.

In summary, the present invention has improved the defects in the prior art, such as air can not flow between metal pieces longitudinally, the heat dissipating fins has no preferred heat dissipating efficiency, so that the heat dissipating ability is not preferred, further, the bottom of the heat dissipating fin is formed as a plane, so that it can not be modified as desired, therefore, the application is confined. Therefore all above said defects in the prior art is improved.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A flow channel type heat dissipating fin set formed by a plurality of metal pieces, each metal piece comprising:
    a body; and
    a connecting piece installed on the body having one or more connecting pieces punched from the body; the connecting piece being protruded from one side of the body; a via hole being formed on the body; and
    buckles and buckling holes being formed on the body;
    wherein the metal pieces are combined by buckling the buckles and buckling holes so that the metal pieces are continuously buckled and stacked as a heat dissipating fin set; and via holes on the bodies of the metal pieces are formed as longitudinal flow channels.

2. The flow channel type heat dissipating fin set as claim in claim 1, wherein the buckle and buckling hole of the connecting unit are installed at a bottom and a top surface of the connecting piece, respectively.

3. The flow channel type heat dissipating fin set as claim in claim 1, wherein a longitudinal size of the buckling hole of the connecting piece is slightly larger than that of the buckle, so that the after the buckle is buckled to the buckling hole, a little gap is formed therebetween so that a longitudinal length of the heat dissipating fin set is telescopic and flexible.

* * * * *